US011791075B2

United States Patent
Weiss et al.

(10) Patent No.: US 11,791,075 B2
(45) Date of Patent: Oct. 17, 2023

(54) IRON-BASED SUPERCONDUCTING PERMANENT MAGNET AND METHOD OF MANUFACTURE

(71) Applicants: The Florida State University Research Foundation, Inc., Tallahassee, FL (US); Japan Science and Technology Agency, Saitama (JP)

(72) Inventors: Jeremy Weiss, Tallahassee, FL (US); Akiyasu Yamamoto, Tokyo (JP); Eric Hellstrom, Tallahassee, FL (US)

(73) Assignees: The Florida State University Research Foundation, Inc., Tallahassee, FL (US); Japan Science and Technology Agency, Saitama (JP)

( * ) Notice: Subject to any disclaimer, the term of this patent is extended or adjusted under 35 U.S.C. 154(b) by 426 days.

(21) Appl. No.: 16/541,377

(22) Filed: Aug. 15, 2019

(65) Prior Publication Data
US 2019/0385769 A1   Dec. 19, 2019

Related U.S. Application Data

(60) Division of application No. 15/722,738, filed on Oct. 2, 2017, now Pat. No. 10,395,805, which is a
(Continued)

(51) Int. Cl.
*H01F 1/08* (2006.01)
*H01F 6/00* (2006.01)
(Continued)

(52) U.S. Cl.
CPC ............. *H01F 1/08* (2013.01); *H01F 6/00* (2013.01); *H01F 13/003* (2013.01); *H01F 41/0253* (2013.01); *H10N 60/855* (2023.02)

(58) Field of Classification Search
CPC ............ H01F 1/08; H01F 6/00; H01F 13/003; H10N 60/855
See application file for complete search history.

(56) References Cited

U.S. PATENT DOCUMENTS

| 4,859,976 A | 8/1989 | Leupold |
| 2005/0068140 A1* | 3/2005 | Huang ................. G01R 33/383 324/318 |

(Continued)

FOREIGN PATENT DOCUMENTS

WO    2013/178550 A1    12/2013

OTHER PUBLICATIONS

Kim et al., "Evidence for Composition Variations and Impurity Segregation at Grain Boundaries in High Current-Density Polycrystalline K- and Co-Doped BaFe2As2 Superconductors", Applied Physics Letters, vol. 105 (2014).
(Continued)

*Primary Examiner* — Paul A Wartalowicz
(74) *Attorney, Agent, or Firm* — Eversheds Sutherland (US) LLP

(57) ABSTRACT

The present invention provides for polycrystalline superconducting permanent magnets which are synthesized of doped superconducting (AE) $Fe_2As_2$ compounds, where AE denotes an alkaline earth metal, such as Ba, Sr, Mg or Ca. The superconducting permanent magnets of the present invention can be magnetized in their superconducting state by induced currents, resulting in trapped magnetization that scales with the size of the bulk material. The magnitude of the trapped field has been demonstrated to be over 1 T and is predicted to be over 10 T if the technology is scaled, which is much higher than the capabilities of permanent magnets and other superconducting polycrystalline bulks currently known in the art.

18 Claims, 9 Drawing Sheets

Related U.S. Application Data continuation of application No. PCT/US2016/025648, filed on Apr. 1, 2016.

(60) Provisional application No. 62/141,659, filed on Apr. 1, 2015.

(51) Int. Cl.
  H10N 60/85 (2023.01)
  H01F 13/00 (2006.01)
  H01F 41/02 (2006.01)

(56) References Cited

U.S. PATENT DOCUMENTS

| | | | |
|---|---|---|---|
| 2008/0113869 A1 | 5/2008 | Selvamanickam et al. | |
| 2010/0323899 A1 | 12/2010 | Giunchi | |
| 2011/0082041 A1 | 4/2011 | Gilbert | |
| 2013/0196856 A1 | 8/2013 | Li et al. | |
| 2014/0349854 A1 | 11/2014 | Miura et al. | |
| 2017/0152185 A1* | 6/2017 | Kimura | C04B 35/6262 |
| 2022/0402824 A1* | 12/2022 | Surmani Martins | C04B 35/624 |

OTHER PUBLICATIONS

Tamegai et al., "Magneto-Optical Characterization of Iron-Based Superconducting Wires and Tapes", IEEE Transactions on Applied Superconductivity, vol. 23 (2013) (Abstract).

Yao et al., "Transport Critical Current Density of Sr0.6K0.4Fe2AS2/Ag Superconducting Tapes Processed by Flat Rolling and Uniaxial Pressing", IEEE Transactions on Applied Superconductivity, vol. 25 (2015).

European Examination Report for European Application No. 16 774 346.7 dated Oct. 2, 2019.

Weiss et al., "Mechanochemical synthesis of pnictide compounds and superconducting Ba0.6K0.4Fe 2As2 bulks with high critical current density," Supercond. Sci. Technol. 2013. vol. 26:074003.

Zhang et al., "Realization of practical level current densities in Sr0.6K0.4Fe2As2 tape conductors for high-field applications," Appl. Phys. Lett. 2014. vol. 104:202601.

Gao et al., "Achievement of practical level critical current densities in Ba1-xKxFe2As2/Ag tapes by conventional cold mechanical deformation," Sci. Rep. 2014. vol. 4: 1-5.

Durrell, et al., "A trapped field of 17.6 Tin melt-processed, bulk Gd—Ba—Cu-0 reinforced with shrink-fit steel," Supercond. Sci. Technol. 2014. vol. 27:082001.

Yamamoto et al., "Permanent magnet with MgB2 bulk superconductor," Appl. Phys. Lett. 2014. vol. 105:032601.

Fuchs et al., "High trapped fields in bulk MgB2 prepared by hot-pressing of ball-milled precursor powder," Supercond. Sci. Technol. 2013. vol. 26:122002.

Dias, et al., "Nanoscratch and indentation fracture toughness in superconductor Ba—Fe—As single crystals with lamellar structure," Tribol. Int. 2014. vol. 79:84-91.

Lin, et al., "Hot pressing to enhance the transport Jc of Sr0.6K0.4Fe2As2 superconducting tapes," Sci. Rep. 2014. vol. 4:6944.

Gao et al., "High transport Jc in magnetic fields up to 28 T of stainless steel/Ag double sheathed Ba122 tapes fabricated by scalable rolling process," Supercond. Sci. Technol. 2015. vol. 28:012001.

Lynn et al., "Neutron Studies of the Iron-based Family of High TC Magnetic Superconductors," Physica C: Superconductivity. 2009. vol. 469:469-476.

International Search Report and Written Opinion for PCT/US16/25648 {filing date: Apr. 1, 2016) dated Jul. 1, 2016; Applicant: The Florida State University Research Foundation, Inc., et al.

International Preliminary Report on Patentability for PCT/US16/25648 {filing date: Apr. 1, 2016) with a priority date of Apr. 1, 2015; Applicant: The Florida State University Research Foundation, Inc., et al.

* cited by examiner

IRON-BASED SUPERCONDUCTING PERMANENT MAGNET AND METHOD OF MANUFACTURE

CROSS-REFERENCE TO RELATED APPLICATIONS

This application is a division of U.S. patent application Ser. No. 15/722,738, filed Oct. 2, 2017, which is a continuation of International Patent Application No. PCT/US2016/025648, filed Apr. 1, 2016, which claims priority to U.S. Provisional Patent Application No. 62/141,659, filed Apr. 1, 2015. The content of these applications is incorporated herein by reference.

STATEMENT OF GOVERNMENT INTEREST

This invention was made with government support under DMR1306785 and DMR1157490 awarded by the National Science Foundation under the Division of Material Research. The Government has certain rights in the invention.

FIELD OF THE INVENTION

This invention relates to superconducting materials and in particular to iron-based superconducting permanent magnet materials.

BACKGROUND OF THE INVENTION

Permanent magnets are only capable of generating magnetic fields of up to approximately 1 Tesla, thereby rendering them inadequate for applications that rely on higher magnetic fields, such as generators, motors, flywheels, magnetic levitation, magnetic resonance imaging (MRI) and research magnets. The generation of magnetic fields above 1 Tesla requires the use of electromagnets, which greatly increases the implementation cost of these technologies.

Since the discovery of iron-based superconductors in 2008, a tremendous amount of research has been focused on the synthesis and study of these superconductors. Much of the research has been driven by reports of properties that are very appealing for applications, including low anisotropy (around 1-2), high upper critical fields ($H_{c2}$) (in excess of 90 T) and intrinsic critical current densities (above 1 MAcm$^{-2}$ (0 T, 4.2 K)). Unfortunately, soon after their discovery the grain boundaries in these iron-based superconductor materials were observed to block current, similar to rare-earth barium cuprate (REBCO) materials such as $YBa_2Cu_3O_{7-x}$ (YBCO), but to a somewhat lesser extent. Remarkably, fine-grain, randomly oriented K-doped $BaFe_2As_2$ (Ba122) has been synthesized with global critical current density around 10 kAcm$^{-2}$ (4.2 K, 10 T) and textured tapes of K-doped Ba122 and $SrFe_2As_2$ (Sr122) have now been produced that raise $J_c$ by another order of magnitude.

While mechanically reinforced superconducting REBCO (Gd—Ba—Cu—O) materials are known in the art that produce record levels of trapped magnetic fields (up to 17.6 Tesla), these magnetically reinforced superconducting materials are limited in size (radius ≤50 mm) because grain boundaries in the material block current flow, forcing samples of the material to be grown as single crystals to eliminate the grain boundaries. In contrast the superconductor, $MgB_2$, is not subject to intrinsic current blocking and as such, can be manufactured as large diameter polycrystalline bulks to trap magnetic fields. However, the trapped magnetic field of $MgB_2$ has been shown to be limited to around 3 T, which is inadequate for high magnetic field applications.

Accordingly, what is needed in the art is a superconducting material having geometric versatility and improved magnetic field trapping of high magnetic fields at lower temperatures.

SUMMARY OF INVENTION

The present invention provides for polycrystalline materials which are synthesized of doped superconducting (AE) $Fe_2As_2$ compounds, where AE denotes an alkaline earth metal, such as Ba, Sr, Mg and Ca. The bulk materials of the present invention can be magnetized in their superconducting state by induced currents, resulting in bulk trapped magnetization that scales with the size of the bulk material. The magnitude of the trapped field has been demonstrated to be over 1 T and is predicted to be over 10 T if the technology is scaled, which is much higher than the capabilities of permanent magnets and other superconducting polycrystalline bulks currently known in the art. In the Fe-based polycrystalline superconducting permanent magnet of the present invention, the magnet is in a superconducting state, wherein the magnet is spontaneously exciting a magnetic field without the assistance of an external power supply to drive the excitation of the magnetic field within the permanent magnet.

In a particular embodiment, the present invention provides an Fe-based polycrystalline superconducting permanent magnet exhibiting a magnetic field greater than about 1 T at a temperature of less than about 40 K. The polycrystal comprises a square lattice of Fe forming a layered structure and the polycrystal may further comprise one or more of anion elements, including As, P, S, Se, Te, F or O.

In an additional embodiment, a method of manufacturing an Fe-based polycrystal superconducting permanent magnet is provided, including the steps of preparing an Fe-based powder, pressing the Fe-based powder into a first container, heat-treating the Fe-based powder in a second container and magnetizing the Fe-based polycrystal to provide an Fe-based polycrystalline superconducting permanent magnet at a temperature of less than about 40 K. Magnetizing the Fe-based polycrystal to provide an Fe-based polycrystalline superconducting permanent magnet may further include, magnetizing the Fe-based polycrystal using a magnetic field, a pulsed magnetic field, an electric field or an electromagnetic field.

Accordingly, the present invention provides a superconducting material having geometric versatility and improved magnetic field trapping of high magnetic fields at lower temperatures.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Figure 1A:
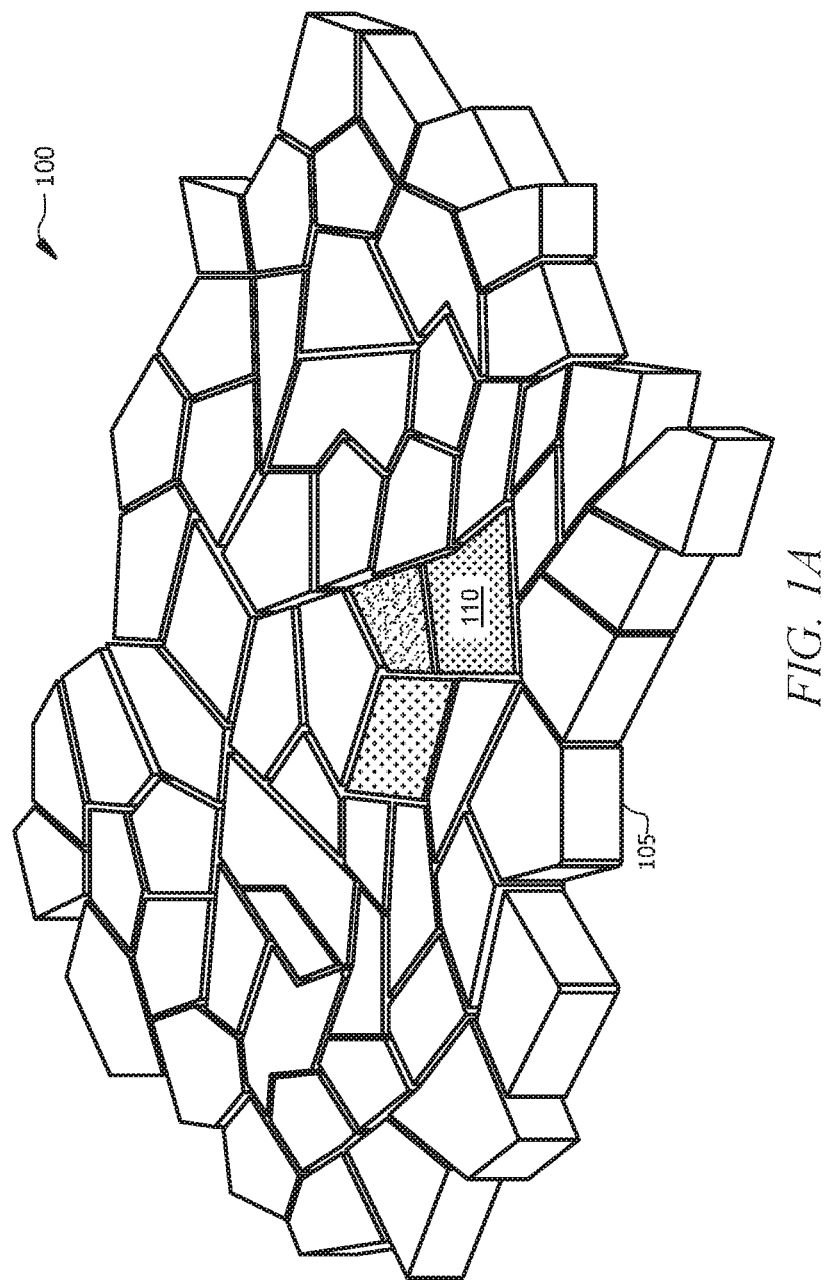
FIG. 1A illustrates an exemplary polycrystal of the superconducting permanent magnet, in accordance with an embodiment of the present invention.

Permanent magnets are limited by their magnetization saturation, and are therefore not capable of producing fields much greater than 1 T. However, induced persistent currents can be trapped inside a superconductor to produce magnetic fields ($B^{trapped}$) that scale with the size of the current loops flowing in the bulk:

$$B^{trapped} = A\mu_0 J_c^{bulk} r$$

where A is a geometrical factor, $\mu_0$ is the permeability of vacuum, $J_c^{bulk}$ is the bulk or globally circulating critical current density, and r is the radius of the sample. High field bulk magnets require high $J_c^{bulk}$ and large r with a well-defined geometry. The field trapping ability is then limited mostly by $J_c(H)(H_{c2}>90$ T for Ba122)[4] and mechanical strength.

Currently, mechanically reinforced REBCO materials produce record fields (>17 T) at modest temperatures (>20 K), but are limited in size (r≤50 mm) because grain boundaries (GBs) block current, forcing such samples to be grown as single crystals. In contrast, $MgB_2$ is not subject to intrinsic current blocking and can be manufactured as large diameter polycrystalline bulks, but currently, $MgB_2$ lacks high enough $H_{c2}$ (limiting $J_c(H)$) to compete with YBCO for high field applications. Despite its lower $T_c$ and $J_c$ than YBCO and $MgB_2$, Ba122 has the geometric versatility of $MgB_2$ with better $J_c(H)$ characteristics in high fields.

In a particular embodiment of the invention, Ba, K, Fe, and As were combined in a molar ratio of 0.6:0.42:2:2 and reacted together by a mechano-chemical reaction followed by sintering in a hot isostatic press (HIP) at 600° C. After the two HIP heat treatments and subsequent re-milling, approximately 3-5 g of Ba122 powder was pressed into 15.9 mm diameter pellets and then further densified in a cold isostatic press (CIP) at 276 MPa. These were then wrapped with Ag foil and inserted into a steel tube that was carefully machined to the diameter of the pellet+foil and both ends were plugged and welded shut under vacuum. The plugs were chamfered towards the pellet to help the steel tube compress around the pellet. The welded tubes were then swaged and CIPped as above, reducing the diameter of the samples ~10%. Finally, the samples were heat treated again for 10 hours at 600° C. in the HIP. After heat treatment, the steel tubes were sliced with a diamond saw to reveal the pellet surfaces. Several room-temperature Vickers hardness (HV) measurements were made on the surface of the pellets using loads from 25 g to 2000 g. Light and scanning electron microscopy was used to study and measure the micro-indentations.

Magneto optical (MO) imaging was used to image the local field profile produced by magnetization currents induced by field-cooling into the superconducting state in 120 mT applied perpendicular to the bulk sample's surface and then removing the magnetic field. Due to the limited size of the cryostat, MO imaging was done on a 3.7 mm thick sample. Then, disk-shaped 122 bulks with ~10 mm in diameter and ~18.4 mm in total thickness were vertically stacked on either side of a spacer containing a transversal cryogenic Hall sensor to measure the magnetic flux density between the pellets. Another Hall sensor was mounted to the outside end of the stack. The stack was cooled to ~5 K by a GM cryocooler under an external field ($H_{app}$) of 8 T, and the external field was subsequently removed. After the field-cooling magnetization and reduction of the external field to zero, the magnetic flux density trapped in the bulk was measured at the center of the spacer as a function of increasing temperature (0.2 K/min) and separately as a function of time. For the magnetic hysteresis loop measurement, the sample was zero-field cooled to 5 K and its flux density in the sample stack was recorded as a function of increasing and decreasing external field.

In a particular embodiment, the superconductors of the present invention were manufactured by hot isostatic pressing pre-reacted powders using the scalable powder-in-tube technique. Vickers hardness indentations indicate that the bulk material has high hardness of greater than about 1 GPa and a fracture toughness of greater than about 1 MPa m$^{0.5}$. Given that the sample diameter is relatively small with $Ba_{0.6}K_{0.4}Fe_2As_2$ showing large irreversibility field (>90 T) and small decay of $J_c$ in high fields, larger bulks are expected to trap much higher fields in excess of 10 T.

Figure 1B:
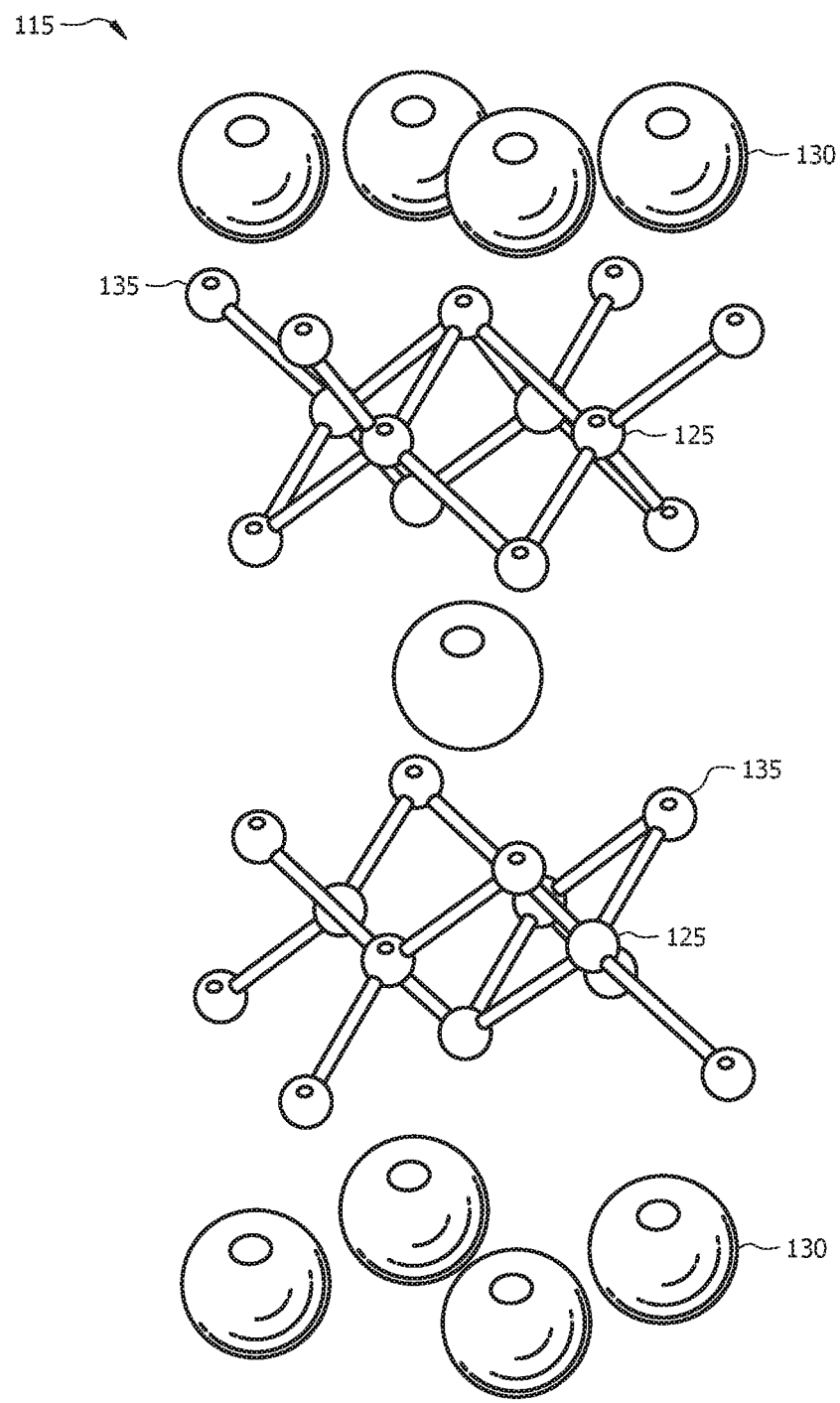
FIG. 1B illustrates the crystalline structure of the Fe-based polycrystalline superconducting permanent magnet, in accordance with the present invention.

FIG. 1A illustrates a polycrystal 100 of the Fe-based superconducting permanent superconductor, in accordance with an embodiment of the present invention. The polycrystal 100 of the permanent magnet comprises randomly ordered polycrystals 105, 110. The polycrystals may be textured or untextured. FIG. 1B illustrates the polycrystalline structure of the Fe-based superconductor (122 phase) 115. The polycrystalline structure including Fe atoms 125, alkaline earth metal atoms 130 and pnictide atoms 135.

Figure 2:
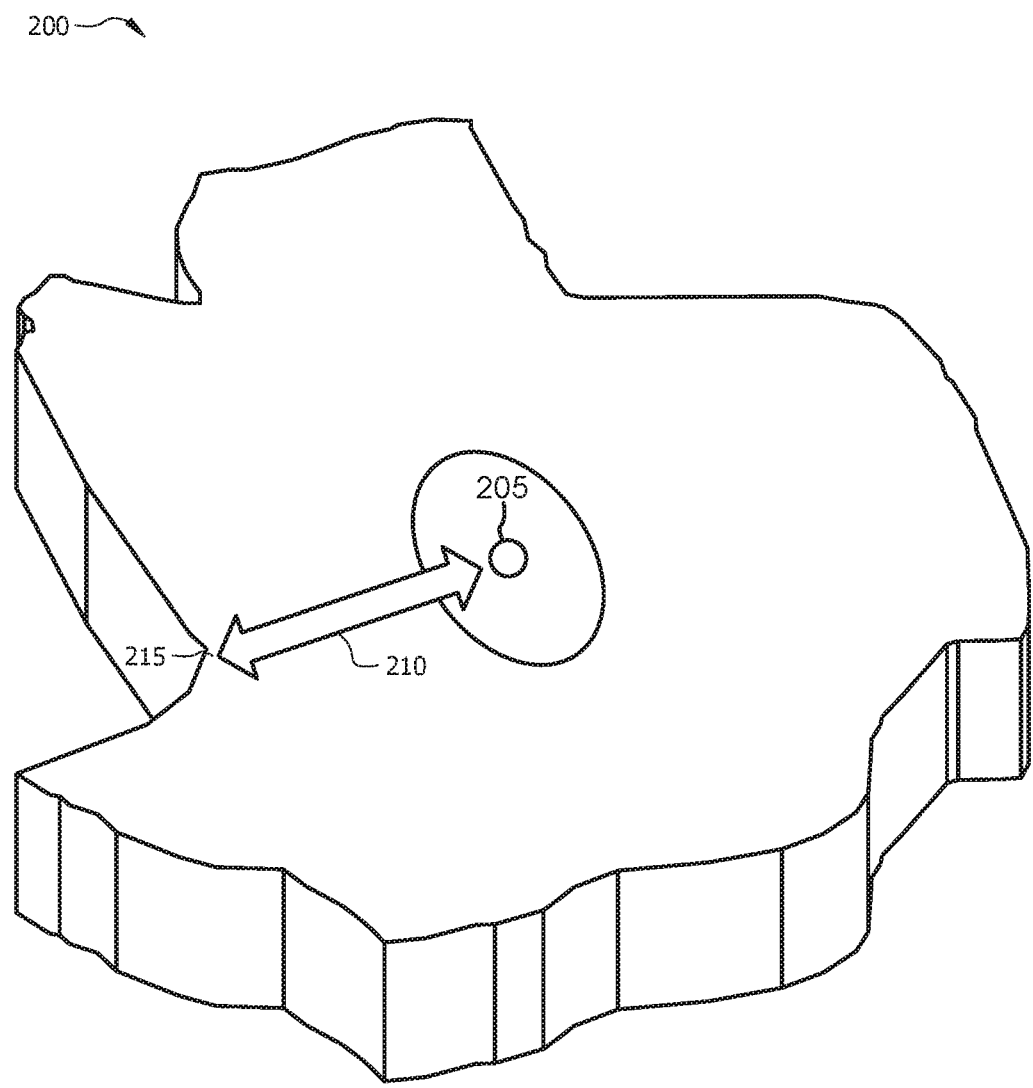
FIG. 2 illustrates the dimensions, relative to the magnetic field, of an exemplary Fe-based polycrystalline superconducting permanent magnet, in accordance with an embodiment of the present invention.

With reference to FIG. 2, the Fe-based polycrystalline superconducting permanent magnet 200 of the present invention is characterized in that in a planar surface perpendicular to magnetic field lines, the shortest distance 210 from a center of the magnetic field lines 205 to an edge of the planar surface 215 is within a range of about 1 mm to a about 10,000 mm.

To assess the mechanical properties of the Ba122 bulks, room temperature Vickers Hardness tests were performed.

Figures 3A, 3B, 3C:
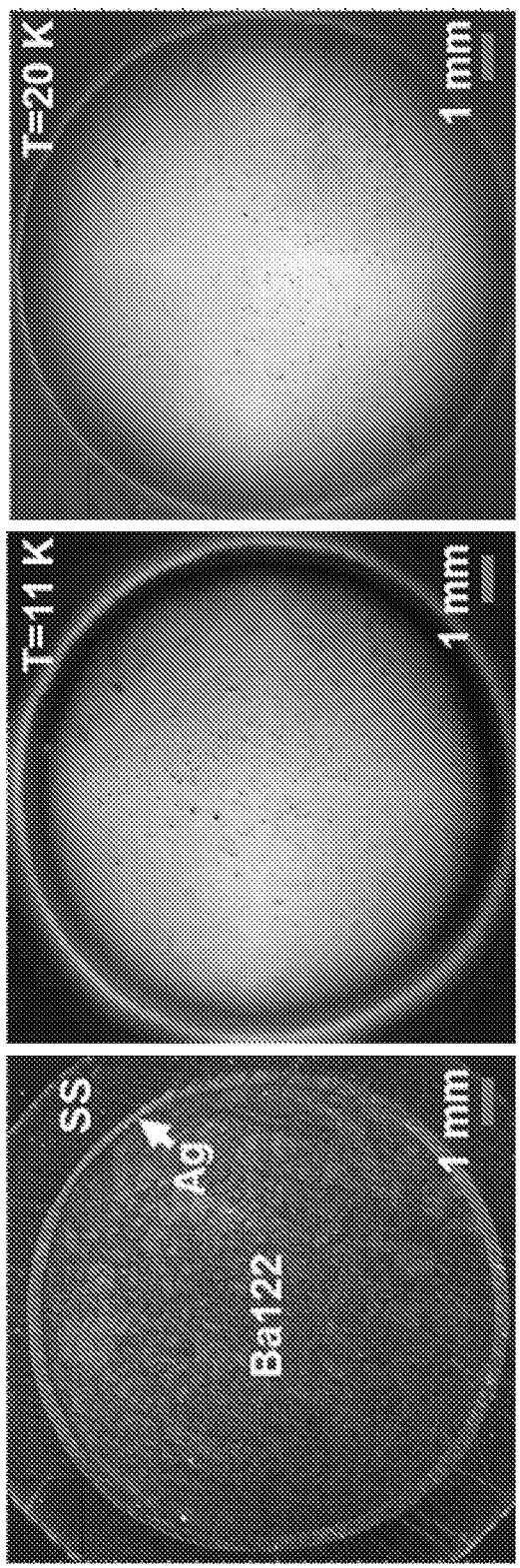
FIG. 3A illustrates a light microscopy image of a polished surface of a disk-shaped K-doped Ba122 bulk sample (10 mm diameter and 3.7 mm thick), in accordance with an embodiment of the present invention.
FIG. 3B illustrates Remnant (Happ=0) magneto optical images at 11 K the sample field-cooled under 120 mT, in accordance with an embodiment of the present invention.
FIG. 3C illustrates Remnant (Happ=0) magneto optical images at 20 K the sample field-cooled under 120 mT, in accordance with an embodiment of the present invention.

The average HV was 3.5 (±0.2) GPa. Cracks were observed propagating from the corners of the indentations, which is typical of brittle materials. FIG. 3A shows an optical image of one of the bulks with thickness=3.7 mm. The magnetic flux density produced by bulk current circulating over the sample is visualized in FIG. 3B and FIG. 3C by magneto optical imaging. FIG. 3B and FIG. 3C show remnant magnetic flux ($H_{app}$=0) from induced currents that were trapped by applying magnetic fields of 120 mT and then field-cooling the sample from above Tc to 11 K and 20 K, respectively, followed by removal of the applied magnetic field. The images show macroscopically uniform trapped field gradient at the perimeter. The light colored contrast in FIG. 3B and FIG. 3C corresponds to a high flux density perpendicular to the sample surface.

Figure 4:
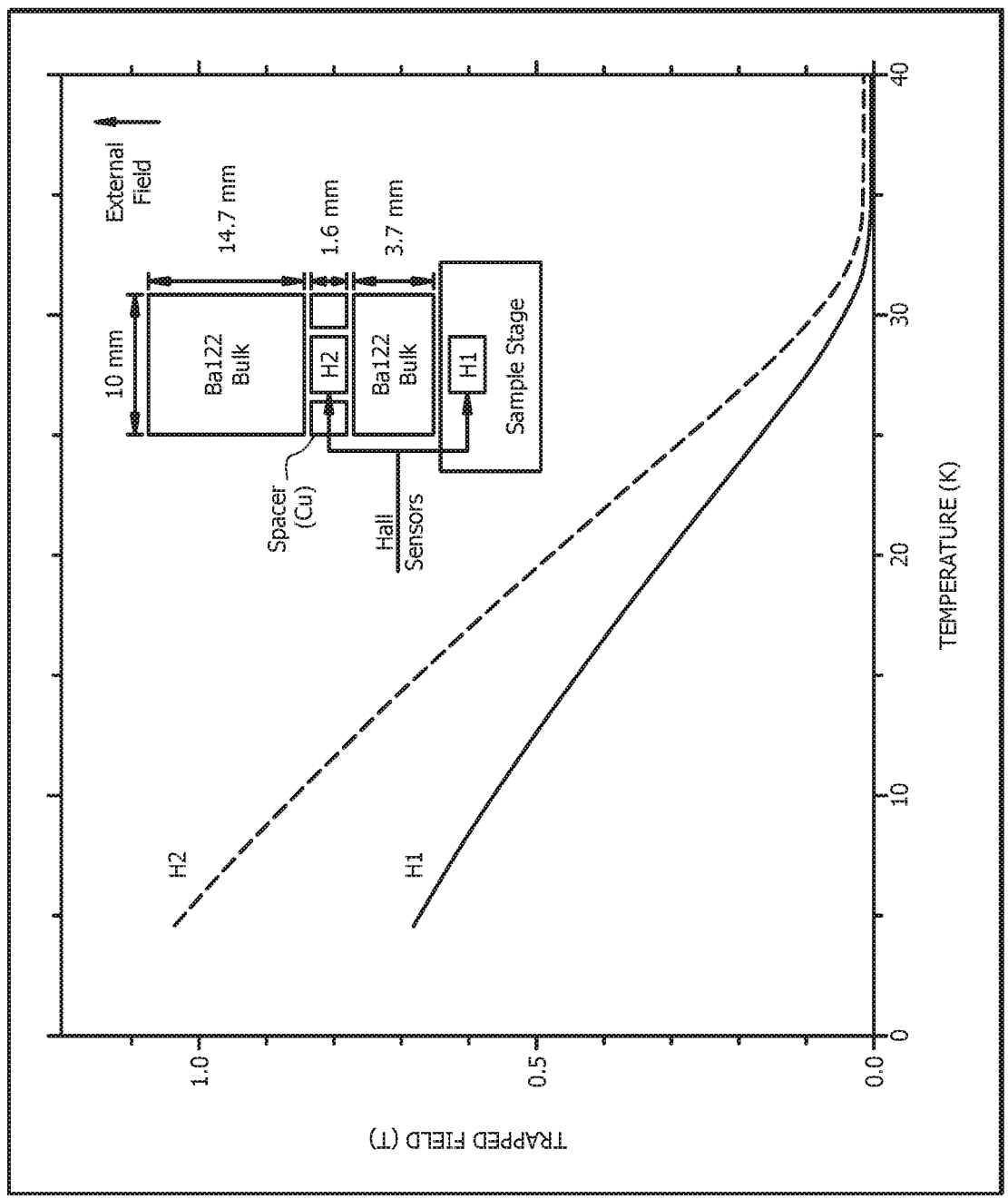
FIG. 4 illustrates the trapped field as a function of increasing temperature for the bulk sample stack that was field-cooled magnetized at 5 K and a simplified schematic of the sample and Hall probe arrangement.

FIG. 4 shows the trapped field (at $H_{app}$=0) measured by Hall sensors placed on the surface (H1) and between (H2) the stack of Ba122 bulk magnets after field cooling ($H_{app}$=8 T) as a function of increasing temperature. It should be noted that H2 was placed 3.7 mm away from H1, which is 5.5 mm from the center of the stack where the maximum field would be expected. At 5 K, the bulk stack trapped 0.68 T on the outer surface (H1) and 1.02 T between the bulks (H2). The trapped field decreased with increasing temperature and vanished at $T_c$~33 K. The average macroscopic current density, which was estimated by a Biot-Savart approximation using the total thickness of the magnet stack and the experimentally obtained trapped field from H1, is ~50 kAcm$^{-2}$. This matches $J_c$ obtained by local magnetization measurements made on small bulk samples at T=4.2 K and $H_{app}$=0.6 T.[9]

On field cooling, no magnetic flux jumps were observed at a ramp rate of 1.8 T/h. In one instance, an unexpected quench of the magnetizing magnet resulted in a rapid (~1 second) removal of external field from $H_{app}$=1.5 T to 0 T, corresponding to a ramp rate of >2 T/sec. Despite the sudden removal of flux, the trapped field value quickly shifted the expected critical state and magnet creep behavior was identical to data taken during the controlled process where $H_{app}$ was slowly removed.

Figure 5:
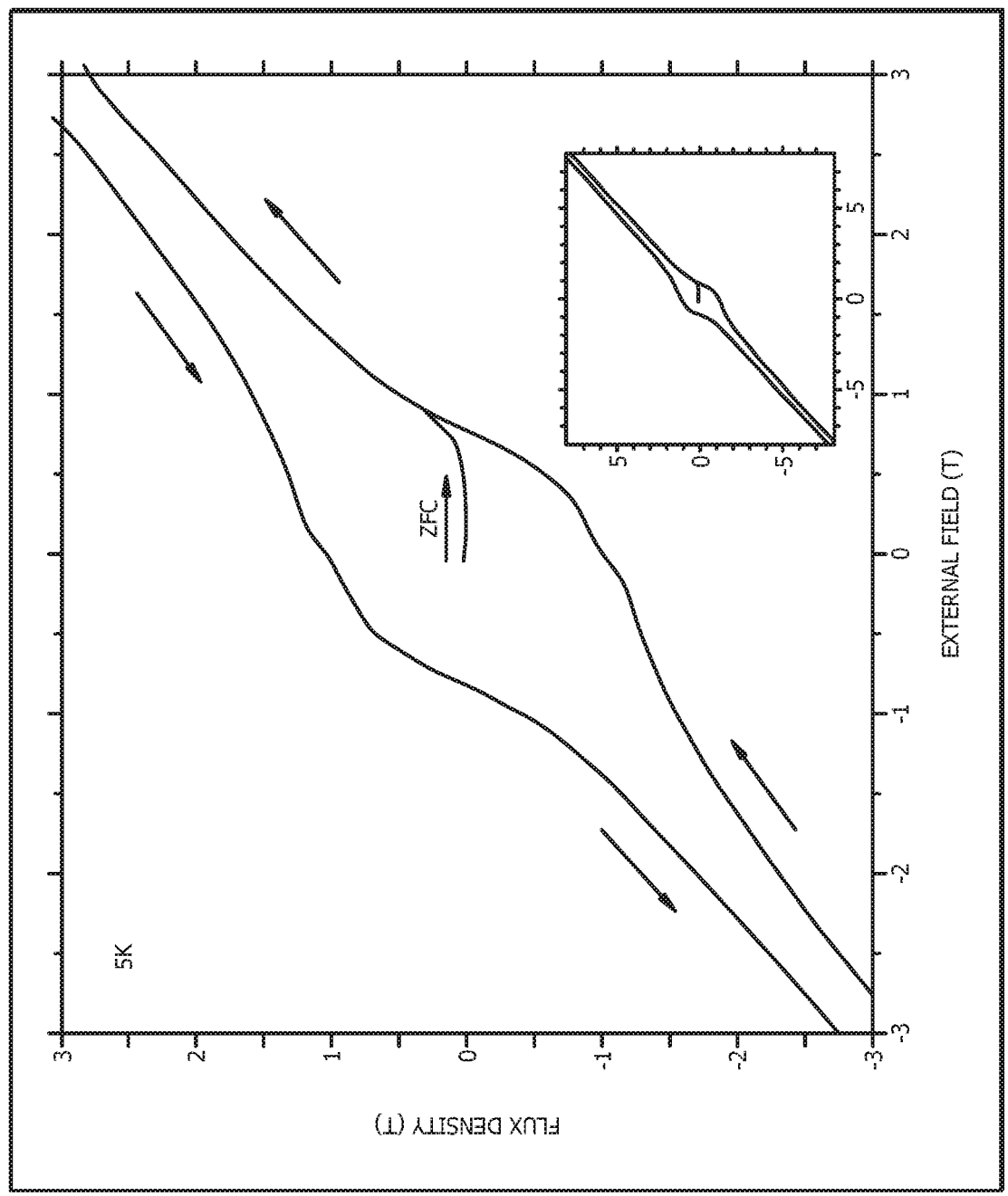
FIG. 5 illustrates a magnetic hysteresis loop obtained at 5 K, in accordance with an embodiment of the present invention.

FIG. 5 shows the magnetic flux density inside the stack of the initially zero-field cooled bulk samples as a function of increasing and decreasing external field. In this embodiment, the sample was zero-field cooled to 5 K and the flux density inside the sample stack (at H2) was recorded as a function of increasing and decreasing external field. The inset shows that the hysteresis loop remains open beyond our maximum applied field of 8 T. The samples showed good shielding behavior below $H_{app}$=0.7 T and the hysteresis loop remained open at $H_{app}$>8 T (see inset), which was the maximum applied field of the magnetizing magnet.

Figure 6A:
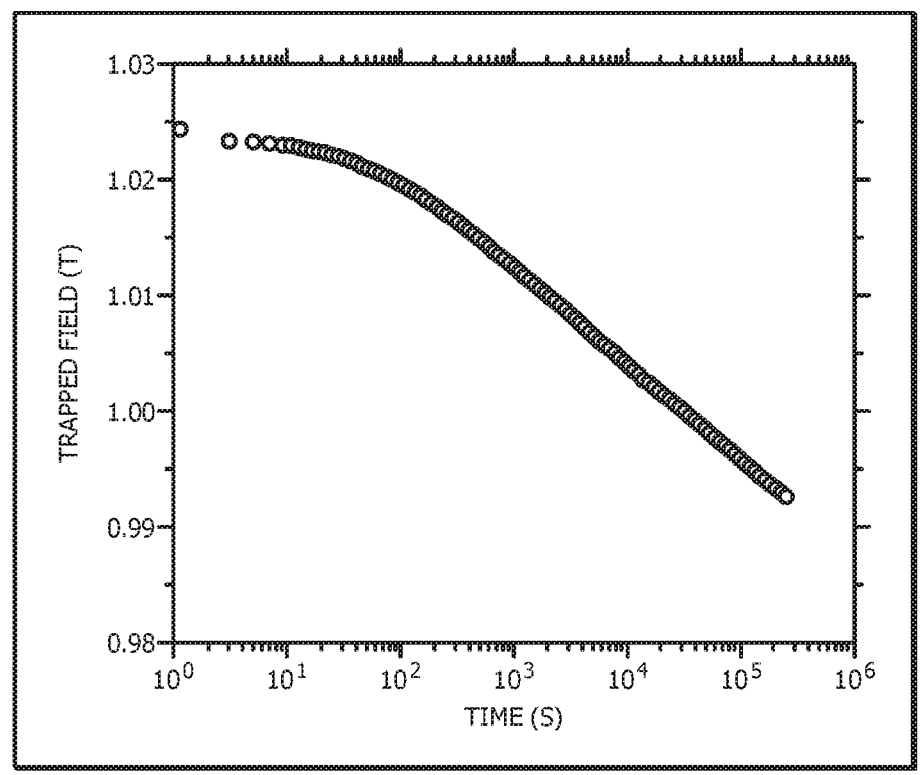
FIG. 6A illustrates the time dependence of a trapped magnetic field magnet creep at H2 and at 5 K, in accordance with an embodiment of the present invention.
Figure 6B:
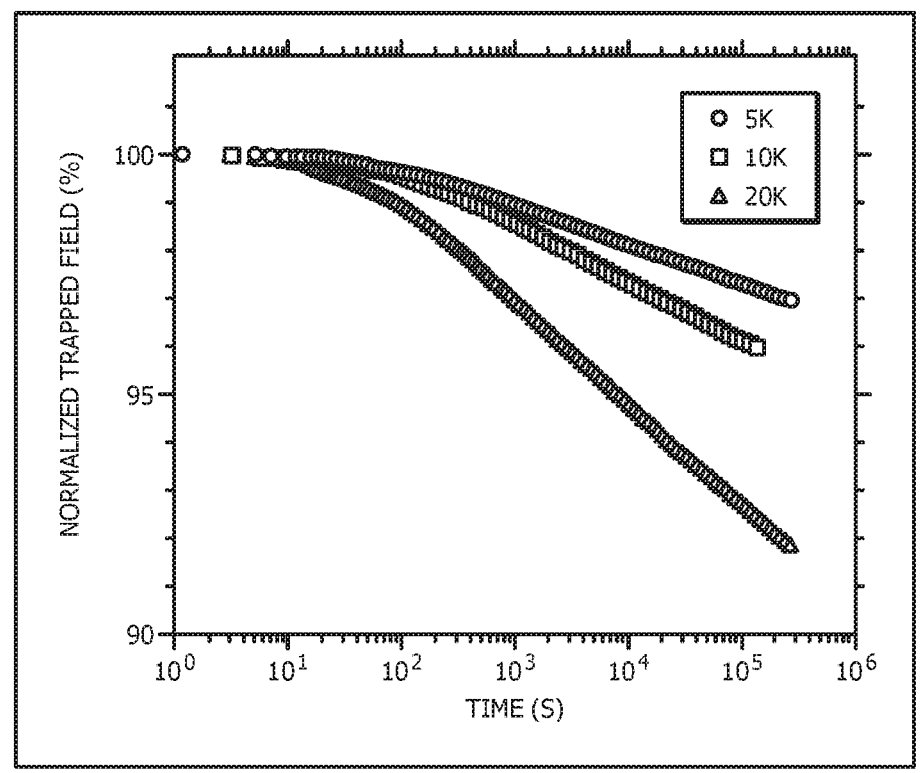
FIG. 6B illustrates the normalized trapped magnetic field magnet creep at H2, as a function of time at 5, 10 and 20 K, in accordance with an embodiment of the present invention.

FIG. 6A shows the time dependence of trapped field at 5 K. The trapped field decayed approximately 3% after one day at 5 K. FIG. 6B shows the normalized relaxation of trapped field as a function of time measured at 5 K, 10 K, and 20 K. The magnet creep rate increased with increased holding temperature due to thermally activated flux depinning. The trapped field decayed ~7% after 1 day at 20 K. The flux creep state shown in FIG. 6A and FIG. 6B illustrates the weak decay of the magnetic field resulting from the intrinsic property of large K-doped Ba122. For practical use as a superconducting permanent magnet, adjustments from this critical state can be made to thermally stabilize the flux state to approximately <0.1 ppm/h, thereby providing an ultra small decay. Accordingly, after the magnetic field is trapped, either one or all of temperature, electric current, and magnet field may be controlled, to establish a more stable magnetic field than is exhibited in the critical state.

The bulk magnets were processed by a scalable and versatile low-cost technique using milling, CIPping and HIPping, which are common ceramic processing techniques used in the industry. The powder-in-tube technique and subsequent low-temperature reaction allow for several bulks to be produced in a single batch. They can then be sliced to a desired thickness, with the length and diameter of the HIP limiting the maximum bulk dimensions. In addition, the steel tubing adds a reinforcing ring that can easily be designed to further improve the mechanical strength of the bulk, as has proven invaluable for trapping high fields using REBCO bulks. High strength bulks and external reinforcement are important because the interaction between trapped field and current results in mechanical force that is proportional to $J_c \times B$. Due to their brittle failure mechanics, superconductors with high fracture toughness ($K_C$) are desired for high field applications. A $K_C$ of ~2.35 (±0.14) MPa m$^{0.5}$ was roughly calculated from the length of micro-cracks propagating from the corners of the micro-indentations according to the following formula:

$$K_C = 0.0726 \frac{P}{c^{3/2}}$$

where P is loading force in N, C is the distance between center of indention and the tip of the crack in m, and 0.0726 is a calibration constant. This fracture toughness exceeds single crystal Mn-doped Ba122, HIPped MgB$_2$, bulk top-seeded melt-grown YBCO, and is about equal to polycrystal Al$_2$O$_3$. Table 1 summarizes the properties of Ba122 compared to YBCO and MgB$_2$ bulks.

The flux distribution observed by MO imaging indicates that the current trapped in the bulks is distributed macroscopically around the entire bulk sample. No flux avalanches were observed by Hall measurements during the magnetization process, even when the magnetizing magnet quenched, as discussed above, which suggests Ba122 is less susceptible to flux jumps and avalanches than MgB$_2$ and YBCO bulks. This may be attributed to high thermal conductivity in the metallic Ba122 bulks or good thermal stability because of the small sample size tested here. While high $H_{irr}$, supported by FIG. 3, suggests potential use for Ba122 bulks to trap high magnetic fields, the magnet creep rate (~3% after a day at 5 K) is still higher than in MgB$_2$ (~1.5% at 20 K)[16].

Figure 7A:
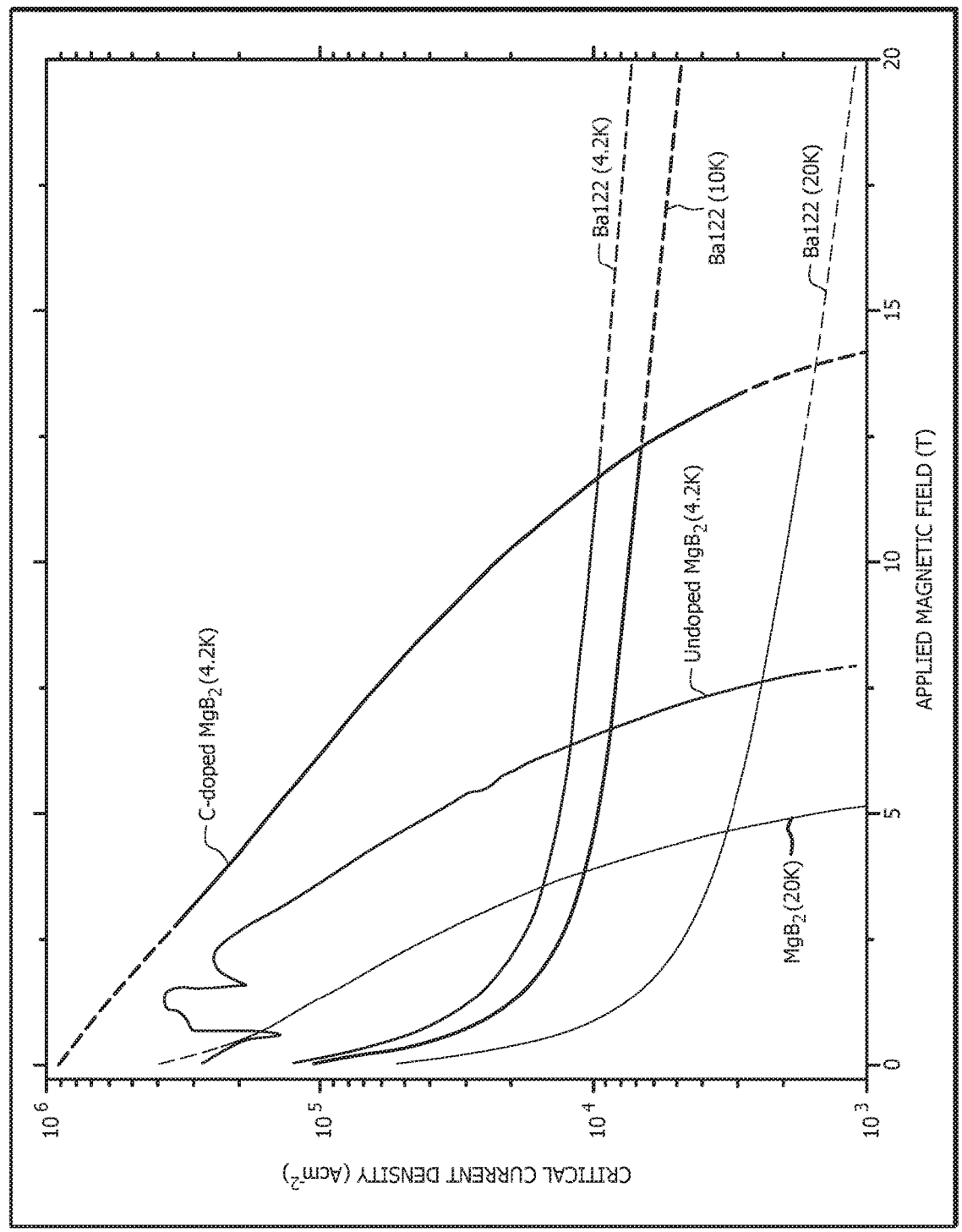
FIG. 7A illustrates the critical current density vs. applied magnetic field for Ba122, undoped $MgB_2$, and C-doped $MgB_2$ bulks, wherein the dotted lines are extrapolated data, in accordance with an embodiment of the present invention.
Figure 7B:
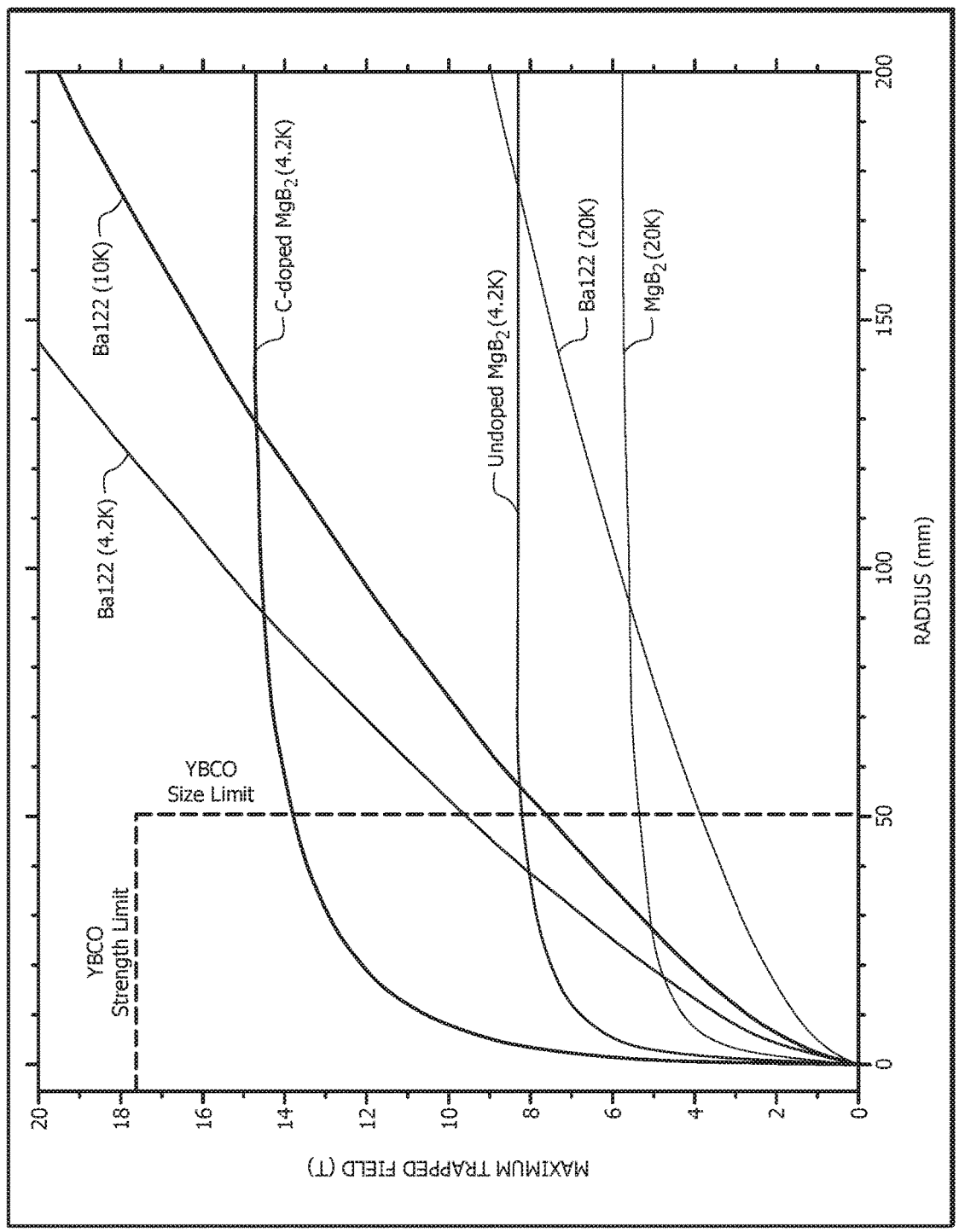
FIG. 7B illustrates the maximum trapped field vs. radius for K-doped Ba122 and $MgB_2$ polycrystalline bulks calculated from the data in FIG. 7A, for an infinite thickness cylinder, in accordance with an embodiment of the present invention.

FIG. 7A shows a comparison of $J_c$(H) data taken from the literature. FIG. 7B shows a calculation of maximum B$^{trapped}$ as a function of r for K-doped Ba122 and MgB$_2$ using the bulk $J_c$(H) data presented in FIG. 7A. This calculation is for an infinitely long cylinder and takes the radial field dependent $J_c$ into account. In the infinitely long cylinder geometry ($A_0$=1), local current density j(x) varies with respect to radial direction x (0<x<r) due to self-field but does not change with respect to circumferential and length directions. Thus, local flux density b(x) and j(x) can be calculated as, $$b(x) = \int \mu_0 j(x) dx, j(x) = J_c(b(x))$$

The maximum B$^{trapped}$ at the center of a bulk is given as b(r). We included $J_c$ data for C-doped MgB$_2$ bulk material, though MgB$_2$ bulk magnets in the literature are typically undoped and therefore have not demonstrated the ability to trap the high fields suggested by FIG. 7(b) at 4.2 K. While MgB$_2$ outperforms Ba122 at low fields and small r, Ba122 bulks are very competitive above the size limit of YBCO (r>50 mm) at low temperatures, and samples with r≥92 mm would be capable of trapping higher fields than $MgB_2$, even at 20 K. Such large bulks would be useful for magnetic levitation in energy storage applications and could provide high fields in compact magnetic resonance devices.

The trapped field at the surface of the magnetized stack of Ba122 bulks as measured by H1 was 0.68 T. The magnitude of the field at the center of the stack is expected to be approximately twice this value ~1.36 T. H2, which measured 1.02 T, was located between H1 and the center of the stack, and is in-between 0.68 and 1.36 T. The expected central trapped field ~1.36 T, given the radius ~5 mm, is about 65% of the ideal maximum trapped field presented in FIG. 7B, likely due to the finite thickness of the sample and slightly lower $J_c(H)$ behavior than presented in FIG. 7A.

TABLE 1

Comparison of superconducting and mechanical properties for YBCO, $MgB_2$ and K-doped Ba122

| Material | Form | $T_c$ (K) | $H_{c2}(0K)$ (T) | Hardness (GPa) | Fracture toughness (MPa m$^{0.5}$) | Limiting size (mm) |
|---|---|---|---|---|---|---|
| YBCO | Single crystal | 92 | >100 | 7-8 | 1.4-1.6 | r~50 |
| $MgB_2$ | Polycrystal | 39 | ~30 | 10-12 | 1.3-1.4 | no limit |
| Ba122 | Polycrystal | 38 | ~90 | 3.5 (±0.2) | 2.35 (±0.14) | no limit |

While high-field applications for Ba122 using much larger bulk samples look very promising, the current Ba122 bulks may not be very competitive against $MgB_2$ at low-fields due to their higher magnetic creep rate and lower $J_c$ at low-fields. However, given improved $J_c$ properties of Ba122 and Sr122 material reported in the literature, there is still a lot of room to improve $J_c$ by better processing and partial alignment of grains. It is important to note that the values in FIG. 7B are proportional to $J_c(H)$, so modest improvements in $J_c(H)$ are all that is needed for Ba122 to be very competitive with $MgB_2$ even at low fields.

The methods of the present invention have been successful in synthesizing the first bulk iron-pnictide demonstration magnet capable of trapping over 1 T (5 K) and 0.5 T (20 K) by using fine-grain polycrystalline material and a scalable technique that is capable of generating much larger samples. Magneto optical imaging suggests that the novel material has macroscopic currents circulating throughout the entire sample. The time dependence of the trapped field illustrates a low magnetic creep rate (~3% after 24 hours at 5 K). Vickers hardness indentations indicate that the bulk material has a hardness ~3.5 GPa and a fracture toughness ~2.35 MPa m$^{0.5}$. Larger bulks are expected to trap even higher fields, given the high $H_{c2}$ of K-doped $BaFe_2As_2$. Modest improvements to $J_c(H)$ will make Ba122 bulks very competitive against REBCO and $MgB_2$ for permanent magnet applications.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A method of manufacturing a superconducting permanent magnet comprising an Fe-based polycrystal, the method comprising:
   providing an Fe-based powder;
   pressing the Fe-based powder into a first container;
   heat-treating the Fe-based powder in a second container to provide an Fe-based polycrystal, wherein the Fe-based polycrystal is a disk-shaped bulk Fe-based polycrystal; and
   magnetizing the Fe-based polycrystal with a pulsed magnetic field or an electric field to provide a superconducting permanent magnet comprising an Fe-based polycrystal at a temperature of less than 40K.

2. The method of claim 1, wherein the first container and the second container are the same containers.

3. The method of claim 1, wherein the first container and the second container are different containers.

4. The method of claim 1, wherein the Fe-based polycrystal comprises a square lattice of Fe forming a layered structure.

5. The method of claim 1, wherein the Fe-based polycrystal comprises one or more anion elements.

6. The method of claim 5, wherein the one or more anion elements are selected from the group consisting of As, P, S, Se, Te, F, and O.

7. The method of claim 1, wherein a crystalline grain of the Fe-based polycrystal is smaller than 10 μm.

8. The method of claim 1, wherein the Fe-based powder comprises Fe and one or more of Ba, K, and As.

9. The method of claim 1, wherein the Fe-based powder comprises Ba, K, Fe, and As.

10. The method of claim 9, wherein Ba, K, Fe, and As are present in the Fe-based powder at a mole ratio of about 0.6:0.42:2:2.

11. The method of claim 1, wherein the pressing and the heat-treating of the Fe-based powder comprises sintering the Fe-based powder in the second container, the second container comprising a hot isostatic press.

12. The method of claim 1, wherein the pressing of the Fe-based powder comprises densifying the Fe-based powder in the first container, the first container comprising a cold isostatic press.

13. The method of claim 1, wherein the heat-treating of the Fe-based powder comprises heating the Fe-based powder at about 600° C. for about 10 hours.

14. A method of manufacturing a superconducting permanent magnet comprising an Fe-based polycrystal, the method comprising:
   providing an Fe-based powder;
   pressing the Fe-based powder into a first container;
   heat-treating the Fe-based powder in a second container to provide an Fe-based polycrystal, wherein the Fe-based polycrystal is a disk-shaped bulk Fe-based polycrystal; and
   magnetizing the Fe-based polycrystal with a pulsed magnetic field or an electric field to provide a superconducting permanent magnet comprising an Fe-based polycrystal at a temperature of less than 40K,
   wherein a crystalline grain of the Fe-based polycrystal is smaller than 10 μm.

15. The method of claim 14, wherein the Fe-based polycrystal comprises a square lattice of Fe forming a layered structure.

16. The method of claim 14, wherein the first container and the second container are the same containers.

17. The method of claim 14, wherein the Fe-based polycrystal comprises one or more anion elements.

18. The method of claim 17, wherein the one or more anion elements are selected from the group consisting of As, P, S, Se, Te, F, and O.

* * * * *